(12) United States Patent
Lee et al.

(10) Patent No.: US 6,215,715 B1
(45) Date of Patent: Apr. 10, 2001

(54) INTEGRATED CIRCUIT MEMORIES INCLUDING FUSES BETWEEN A DECODER AND A MEMORY ARRAY FOR DISABLING DEFECTIVE STORAGE CELLS IN THE MEMORY ARRAY

(75) Inventors: Kyu-chan Lee, Seoul; Chul-woo Yi, Kyungki-do, both of (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 09/346,567

(22) Filed: Jul. 1, 1999

(30) Foreign Application Priority Data

Jul. 14, 1998 (KR) .................................. 98-28423

(51) Int. Cl.[7] ...................................... G11C 8/00
(52) U.S. Cl. ...................... 365/225.7; 365/200
(58) Field of Search ................... 365/200, 230.06, 365/225.7

(56) References Cited

U.S. PATENT DOCUMENTS

| | | | |
|---|---|---|---|
| 5,323,348 | * 6/1994 | Mori et al. | 365/200 |
| 5,532,966 | 7/1996 | Poteet et al | 365/200 |

FOREIGN PATENT DOCUMENTS

| | | | |
|---|---|---|---|
| 0 213 044 | 3/1987 | (EP) | G06F/11/20 |
| 0 464 577 A2 | 1/1992 | (EP) | G06G/11/20 |

OTHER PUBLICATIONS

EPO Search Report, 99305059.0, Mar. 30, 2000.

* cited by examiner

Primary Examiner—David Nelms
Assistant Examiner—M. Tran
(74) Attorney, Agent, or Firm—Myers Bigel Sibley & Sajovec

(57) ABSTRACT

An integrated circuit memory device includes a two-dimensional memory array in which the first and second dimensions extend in first and second directions respectively. The memory device further includes a decoder for the first dimension and a plurality of fuses between the decoder and the memory array. Upon encountering a defective storage cell in the memory array, the appropriate fuse can be cut to physically segregate the decoder from the defective cell. This allows the memory to operate without any delay inserted for switching to a spare or redundant memory array of storage cells, thus maximizing the memory operating speed. In a preferred embodiment, the fuses are arranged such that the relative spacing between the fuses proceeds substantially along the second direction and the fuses are oriented lengthwise in the first direction. By following this arrangement, the impact on the layout area for the memory device is minimal.

23 Claims, 5 Drawing Sheets

INTEGRATED CIRCUIT MEMORIES INCLUDING FUSES BETWEEN A DECODER AND A MEMORY ARRAY FOR DISABLING DEFECTIVE STORAGE CELLS IN THE MEMORY ARRAY

CROSS-REFERENCE TO RELATED APPLICATION

This application claims the benefit of Korean Patent Application No. 98-28423, entitled "Melting Fuse Box and Integrated Circuit Memory Using the Same," filed Jul. 14, 1998, which is incorporated herein by reference.

FIELD OF THE INVENTION

The present invention relates to the field of integrated circuit memories, and, more particularly, to the use of fuses in an integrated circuit memory to disable defective memory storage cells.

BACKGROUND OF THE INVENTION

To improve the yield of an integrated circuit memory, it is common practice to include redundancy circuits in the device that can be used to repair defective memory storage cells that are unusable as a result of damage incurred during the fabrication process. The redundancy circuits comprise a spare memory decoder and a spare memory array that can replace unusable storage cells from the main memory array.

A high-level block diagram of a conventional integrated circuit memory 8 that includes redundancy circuits is shown in FIG. 1. The integrated circuit memory 8 includes a main memory decoder 10 that is comprised of a plurality of normal decoder components 11–14 and a driving decoder 15. Each normal decoder component 11–14 is coupled to a word line driver 16–19. The word line drivers are coupled to a multi-dimensional, main memory array 20 of storage cells and are used to select a particular word in the main memory array 20. In addition to the main memory decoder 10, a spare memory decoder 21 is wired in parallel to the normal decoder components 11–14 and a spare word line driver 23 is wired in parallel to the word line drivers 16–19 to provide redundancy through a spare memory array 24.

For purposes of illustration, the main memory array 20 is assumed to be a two-dimensional array of rows and columns with the main memory decoder 10 being a row decoder for selecting a row of storage cells from array 20. The main memory array 20 includes $2^{n+1}$ rows of storage cells that are selected by word lines WL0–WL$2^{n+1}$–1. Accordingly, N+1 address bits, identified as RA0–RAN, are used to access the rows in the main memory array 20.

The integrated circuit memory 8 of FIG. 1 operates as follows. When the row address strobe (RAS) line is driven into an active mode, the main memory decoder 10 will receive a row address after some initial predecoding. The normal decoder components 11–14 are used to decode all but the two lowest order bits. The two lowest order bits are decoded by the driving decoder 15. It therefore follows that the normal decoder components 11–14 decode $2^{n-1}$ word lines while the driving decoder 15 decodes four word lines, which results in a total of $2^{n-1}*2^2=2^{n-1}$ word lines being decoded overall.

In addition to providing the row address to the main memory decoder 10, the row address is also provided to the spare memory decoder 21. The spare memory decoder 21 decodes the same bits, RA2–RAN as the normal decoder components 11–14 and selects the appropriate spare word line from the spare memory array 24 through the spare word line driver 23 and the driving decoder 15. Specifically, when defects are encountered in a word selected from the main memory array 20, an output signal XRED is enabled to deactivate the normal decoder component 11–14 that decoded the row corresponding to the defective word. In addition to deactivating the appropriate normal decoder component 11–14, the output signal XRED also activates the spare word line driver 23 to allow access to the spare memory array 24, which serves as a replacement for the defective row in the main memory array 20.

While the aforementioned approach can be effective in providing the necessary redundancy to maintain the yield of the integrated memory circuit 8, it nevertheless can suffer from a significant drawback. The XRED signal that controls access to the redundancy path generally must be enabled before the address is decoded by the main memory decoder 10. Otherwise, a race condition can ensue in which the word lines to both the main memory array 20 and the spare memory array 24 corresponding to the row address will be selected. To avoid this condition, the main memory decoder 10 decodes the address after a defined delay to allow the XRED signal to propagate and disable the correct normal decoder component 11–14 and activate the spare word line driver 23, if necessary. Unfortunately, this delay can lower the operating speed of the integrated circuit memory.

SUMMARY OF THE INVENTION

Certain advantages of the invention will be set forth in the description that follows and will become apparent to those skilled in the art upon examination of the following or may be learned with the practice of the invention.

To achieve the advantages, the present invention is generally directed to integrated circuit memory devices that include a two-dimensional memory array in which the first and second dimensions extend in first and second directions respectively. The memory devices further include a decoder for the first dimension and a plurality of fuses between the decoder and the memory array.

In accordance with one aspect of the invention, the fuses are arranged such that the relative spacing between the fuses proceeds substantially along the second direction.

In accordance with another aspect of the invention, the fuses are oriented lengthwise in the first direction.

By arranging the plurality of fuses between the decoder and the memory array, when a defective storage cell is encountered, the appropriate fuse can be cut to physically segregate the decoder from the defective cell. This can allow the memory to operate without requiring delay to be added for switching to a spare or redundant memory array of storage cells. Memory speed can therefore be increased.

Moreover, by arranging the fuses such that the relative spacing between the fuses proceeds substantially along the direction not corresponding to the dimension being decoded and orienting the fuses lengthwise in the direction corresponding to the dimension being decoded, the layout area for the memory device can be reduced and preferably minimized.

BRIEF DESCRIPTION OF THE DRAWINGS

Other features of the present invention will be more readily understood from the following detailed description of specific embodiments thereof when read in conjunction with the accompanying drawings, in which.

DETAILED DESCRIPTION OF THE PREFERRED EMBODIMENTS

Figure 1:
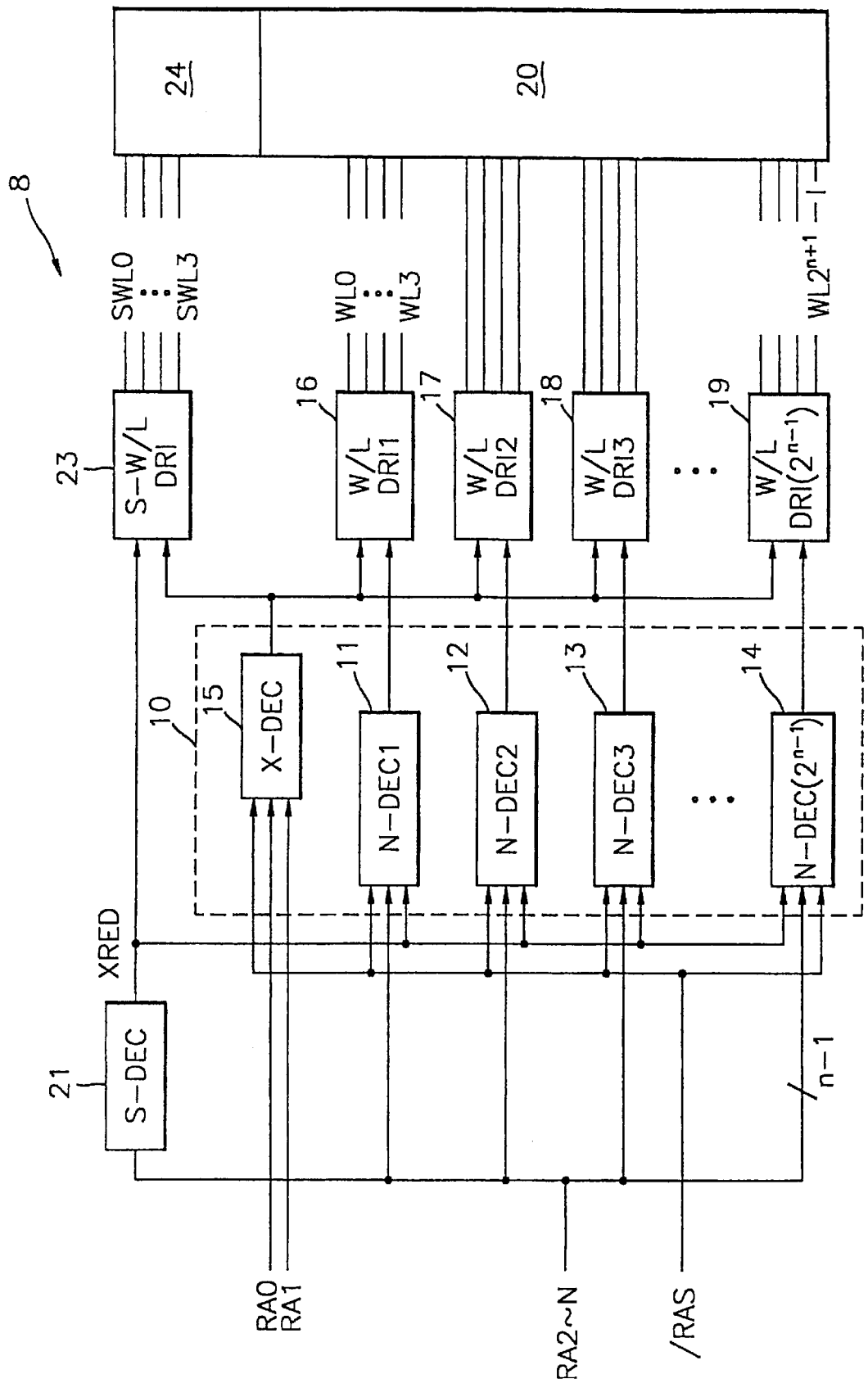
FIG. 1 is a high level block diagram of a conventional integrated circuit memory that includes redundancy components for switching from a conventional main memory array into a spare memory array.

While the invention is susceptible to various modifications and alternative forms, specific embodiments thereof are shown by way of example in the drawings and will herein be described in detail. It should be understood, however, that there is no intent to limit the invention to the particular forms disclosed, but on the contrary, the invention is to cover all modifications, equivalents, and alternatives falling within the spirit and scope of the invention as defined by the claims. In the description of the figures, like reference numbers signify like items throughout the figures. Likewise, similar reference numbers signify similar, but not identical items throughout the figures.

Figure 2:
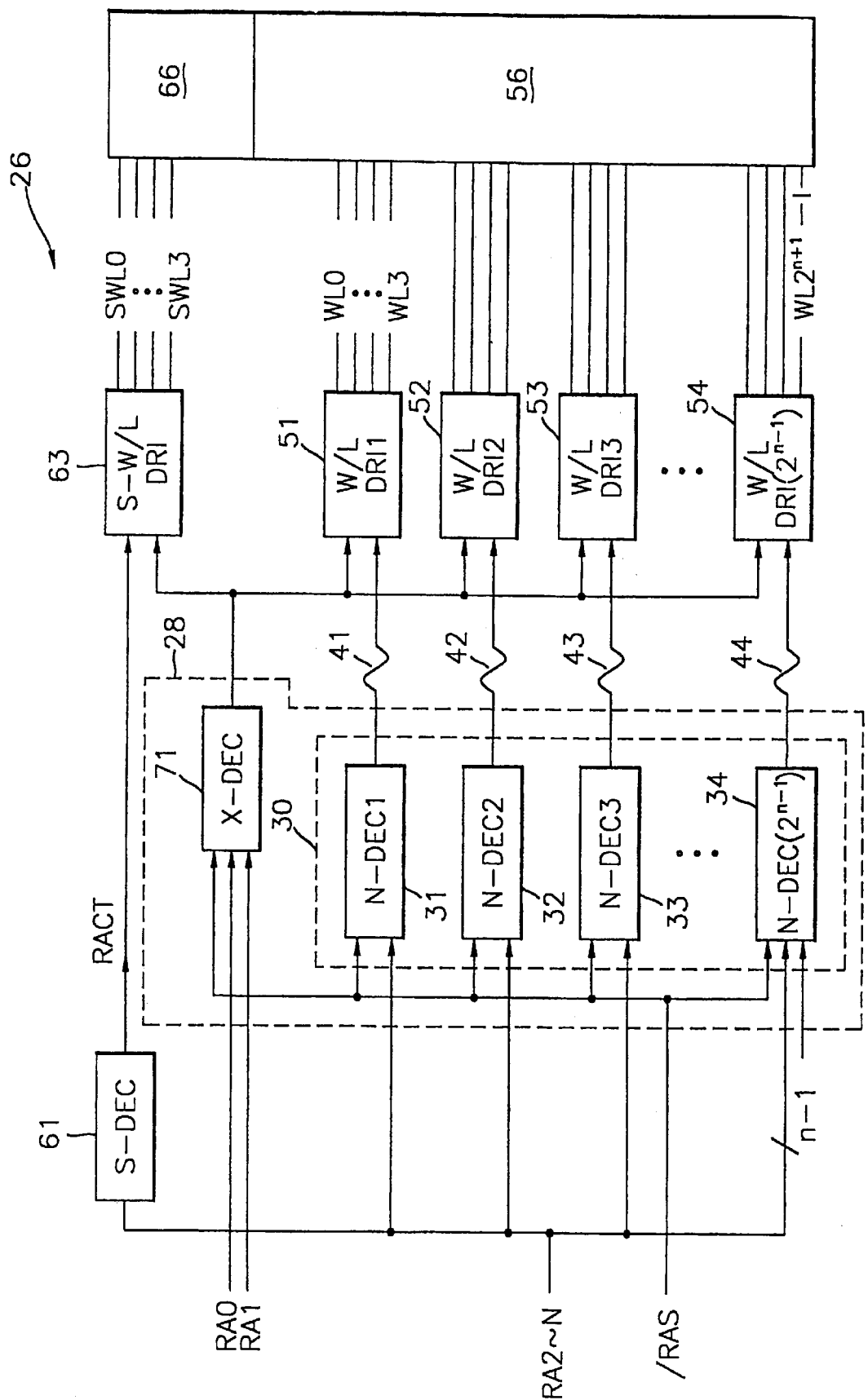
FIG. 2 is a high level block diagram of an integrated circuit memory device in accordance with the present invention that uses fuses between a main memory decoder and a main memory array for switching from the main memory array to a spare memory array.

An integrated circuit memory 26 embodying the principles of the present invention is shown in FIG. 2. The memory 26 includes a main memory decoder 28 that comprises a normal decoder portion 30 and a driving decoder 71. The normal decoder portion 30 decodes all but the two lowest order address bits RA0 and RA1, which are decoded by the driving decoder 71. The normal decoder portion 30 is comprised of a plurality of normal decoder components 31–34 that are coupled via fuses 41–44 to word line drivers 51–54, which are used to select words from main memory array 56. Fuses 41–44 are positioned between the output lines of normal decoder portion 30 and the input lines of the word line drivers 51–54. Alternatively, the fuses 41–44 could be incorporated into the normal decoder components 31–34. The memory 26 also includes a spare memory decoder 61 and a spare word line driver 63, which are connected in parallel with the normal decoder portion 30 and the word line drivers 51–54 respectively. The spare memory decoder 61 and the spare word line driver 63 are used to access the spare memory array 66 to replace defective storage cells in the main memory array 56 as discussed hereinbefore.

For illustration purposes, the main memory array 56 and the spare memory array 66 are assumed to be two-dimensional arrays consisting of rows of storage cells extending in a first direction and columns of storage cells extending in a second direction. Moreover, the present invention is described herein as it is applied to the decoding of rows of storage cells in a two-dimensional memory array. It will be appreciated, however, that the principles of the present invention are equally applicable to the decoding of columns of storage cells in a two-dimensional memory array and, in general, can be used with n-dimensional memory arrays where n≠2.

With reference to FIG. 2, the operation of the memory 26 will be now be described. When the row address strobe (RAS) line is driven into an active mode, the main memory decoder 28 will receive a row address defined by row address bits RA0–RAN. The normal decoder portion 30 decodes bits RA2 through RAN while the driving decoder 71 decodes bits RA0 and RA1. The word line drivers 51–54 use the output signals from the normal decoder components 31–34 and the output signal from the driving decoder 71 to select one word line to be driven from among the four word lines controlled by each word line driver 51–54.

When a defective storage cell in the main memory array 56 is encountered, the path between the normal decoder portion 30 and the main memory array 56 is broken by cutting the fuse connecting the normal decoder component 31–34 related to the defective storage cell. When the fuse is cut, the spare memory decoder 61 outputs a redundancy enable signal, RACT. The spare word line driver 63 uses the output signal from the spare memory decoder 61 and the output signal from the driving decoder 71 to select one word line to be driven from among the four word lines controlled by the spare word line driver 63.

Advantageously, a memory 26, in accordance with the present invention, need not use artificial delays in the normal decoding portion 30 as is sometimes used in prior art designs as discussed hereinbefore with reference to FIG. 1. Moreover, the present invention need not use conversion circuitry to switch between the main memory array 56 and the spare memory array 66, which can increase current consumption.

Figure 3:
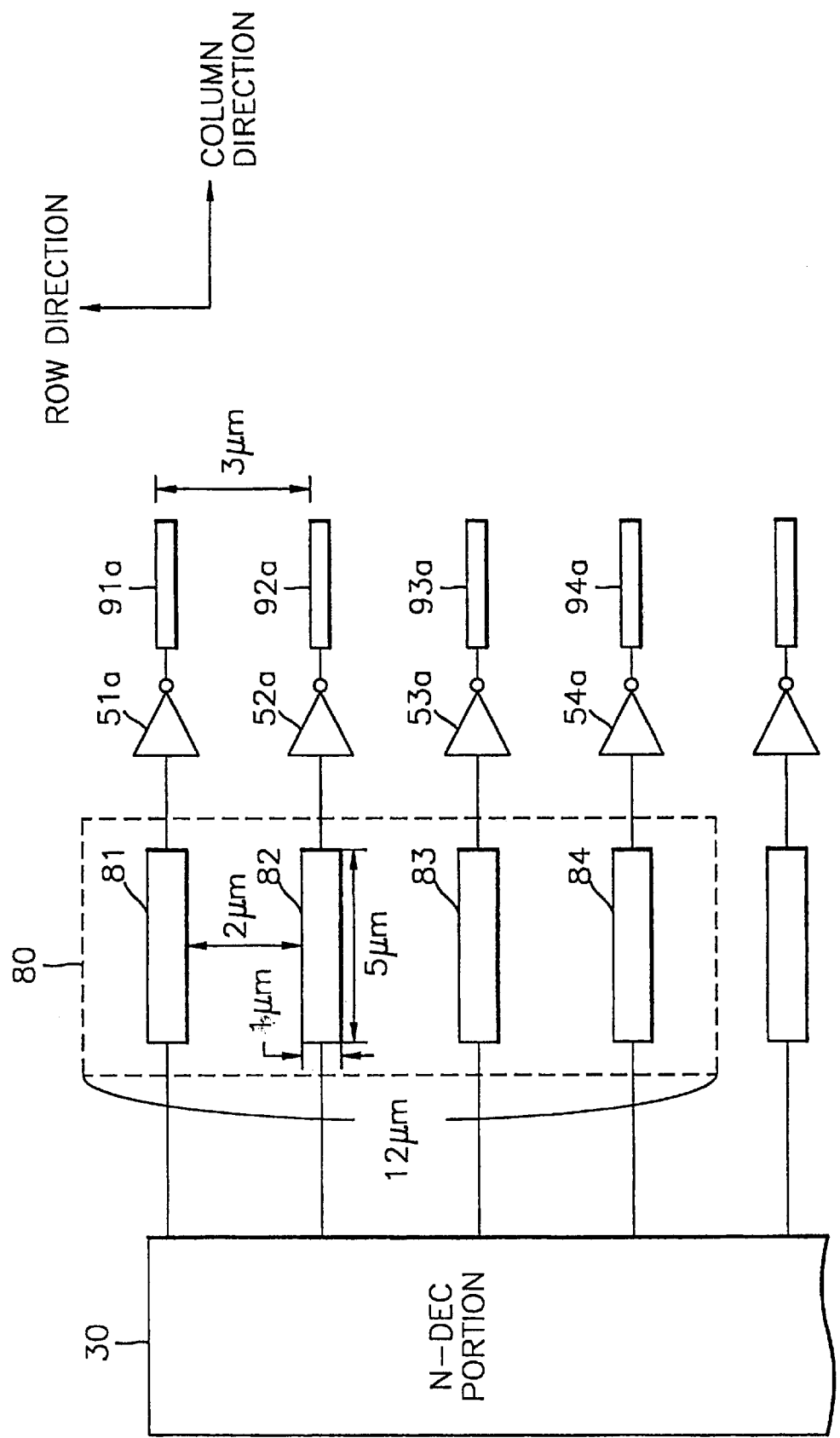
FIG. 3 is a block diagram showing a first arrangement of the fuses of FIG. 2.

FIG. 3 shows a first embodiment of the fuses arranged in the integrated circuit memory 26 of FIG. 2. As shown in FIG. 3, four fuses 81–84 are grouped together to form a fuse box 80. In practice, fewer or more than four fuses can be grouped together in a single fuse box.

The output signals from the normal decoding portion 30 are transmitted to the word line driver row decoders 51a–54a through the fuses 81–84. The word line driver row decoders 51a–54a of FIG. 3 (not shown in FIG. 2) comprise a circuit that is connected to the output signals of the normal decoder portion 30. Accordingly, the output signals 91a–94a of the word line driver row decoders 51a–54a are input signals to the word line drivers 51–54 respectively, shown in FIG. 2.

The output signal lines 91a–94a of the word line driver row decoders 51a–54a are wired in a column direction in the embodiment shown in FIG. 3. Likewise, the fuses 81–84, which are generally elongated such that their length is equal to or longer than their width, are oriented lengthwise or are wired in the column direction. The fuses 81–84 are positioned such that the relative spacing between the fuses 81–84 proceeds substantially along the row direction.

In a preferred embodiment, the minimum distance between the fuses 81–84 is preferably approximately 2 $\mu$m, the minimum width of each fuse is preferably approximately 1 $\mu$m, and the minimum pitch between the fuses is preferably approximately 3 $\mu$m. The marginal pitch between the fuses 81–84 is related to the spot size of a laser beam that is used to cut the fuses 81–84. The length of each fuse is preferably approximately 5 $\mu$m. Therefore, the minimum area occupied by the fuse box 80 is approximately 12 $\mu$m in the row direction and approximately 5 $\mu$m in the column direction. Also, due to the marginal pitch of the fuses 81–84, the pitch between the output signal lines 91a–94a of the word line driver row decoders 51a–54a is approximately 3 $\mu$m.

Figure 4:
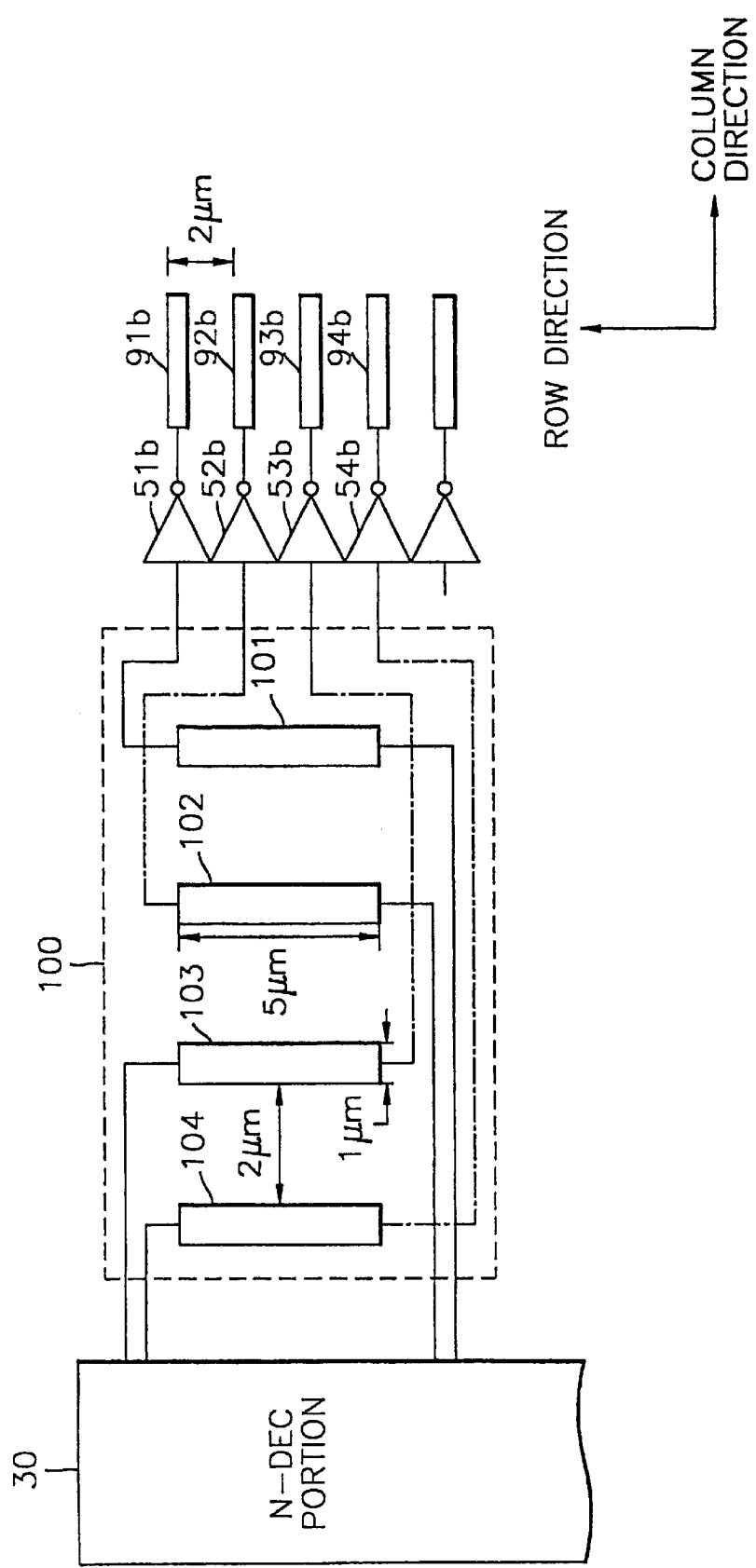
FIG. 4 is a block diagram showing a second arrangement of the fuses of FIG. 2.

FIG. 4 shows a second embodiment of the fuses arranged in the integrated circuit memory 26 of FIG. 2. Referring now to FIG. 4, the output signals from the normal decoder portion 30 are transmitted to the word line driver row decoders 51b–54b through a plurality of fuses 101–104. The word line driver row decoders 51b–54b of FIG. 4 (not shown in FIG. 2) comprise a circuit that is connected to the output signals of the normal decoder portion 30. Accordingly, the output signals 91b–94b of the word line driver row decoders 51b–54b are input signals to the word line drivers 51–54 respectively, shown in FIG. 2.

The output signal lines 91b–94b of the word line driver row decoders 51b–54b are wired in a column direction in the embodiment shown in FIG. 4. Conversely, the fuses 101–104 are oriented lengthwise or are wired in the row direction. The fuses 101–104 are positioned such that the relative spacing between the fuses 101–104 proceeds substantially along the column direction.

Therefore, a difference between the second embodiment of FIG. 4 and the first embodiment of FIG. 3 is the orientation and the spacing of the fuses. Namely, the fuses 81–84 are oriented lengthwise in the column direction and spaced relative to one another in the row direction in the first embodiment of FIG. 3. Conversely, the fuses 101–104 are oriented lengthwise in the row direction and spaced relative to one another in the column direction in the second embodiment of FIG. 4.

As in FIG. 3, the minimum distance between the fuses 101–104 of FIG. 4 is preferably approximately 2 $\mu$m, the minimum width of each fuse is preferably 1 $\mu$m, and the minimum pitch between the fuses is preferably approximately 3 $\mu$m. The length of each fuse is preferably approximately 5 $\mu$m. In FIG. 4, the different types of lines (i.e., dashed or solid) that represent the wiring for the fuses 101–104 imply different layers in the integrated circuit.

Inasmuch as the fuses 101–104 of FIG. 4 are oriented lengthwise in the row direction and spaced apart relative to one another in the column direction, the minimum area occupied by a fuse box 100 in a chip is approximately 5 $\mu$m in the row direction and approximately 12 $\mu$m in the column direction.

Figure 5:
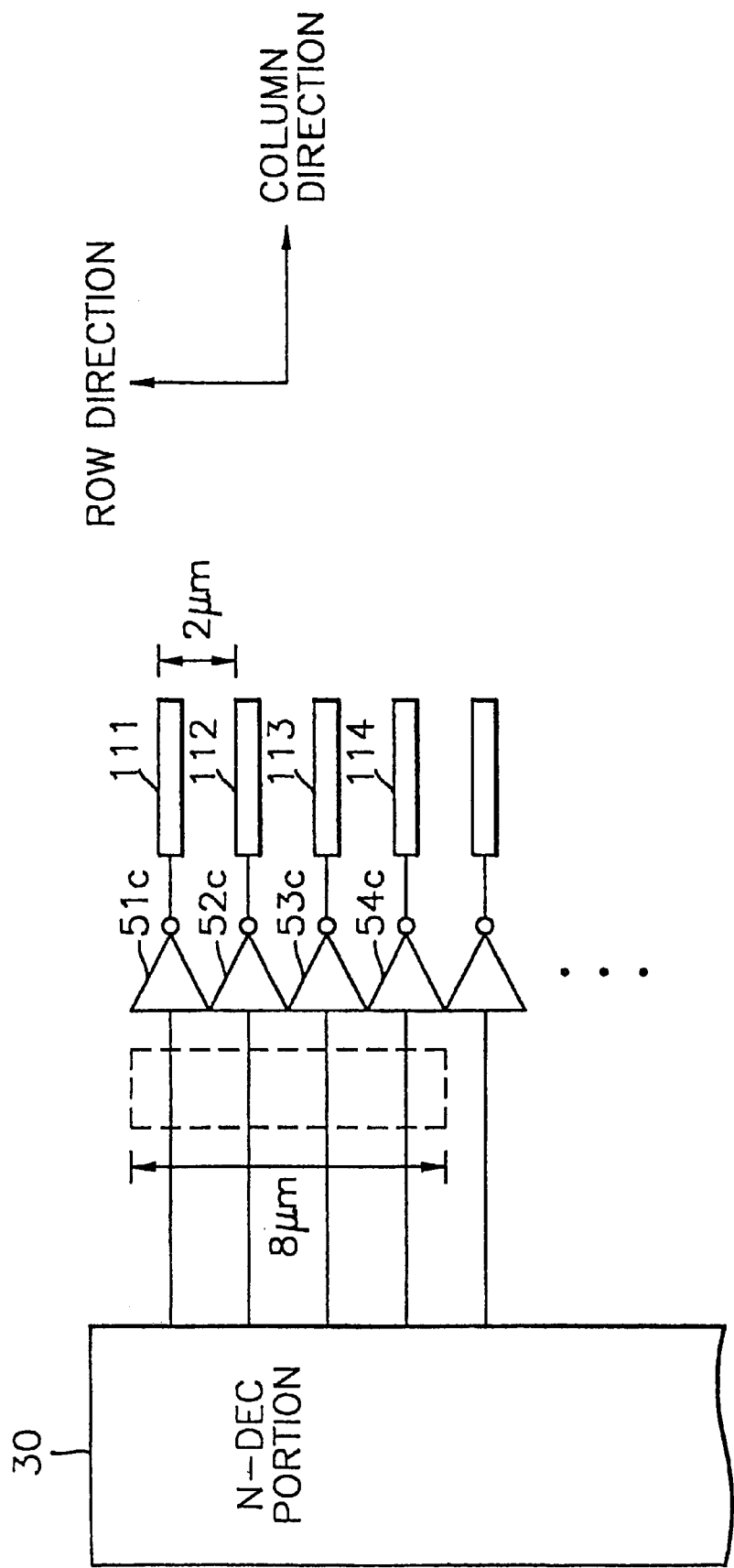
FIG. 5 is a block diagram showing a normal decoder and related wiring for the integrated circuit memory device of FIG. 2 when fuses are not used.

FIG. 5 shows an arrangement and wiring of the word line driver row decoders and output signal lines of FIGS. 3 and 4 without including the fuses. This arrangement is shown for the purpose of calculating a baseline layout area for a memory device without fuses, which can then be compared with the layout areas for the FIG. 3 and FIG. 4 embodiments, both of which include fuses.

Referring now to FIG. 5, the pitch between lines 111–114 of the output signal of the word line driver row decoders 51c–54c is approximately 2 $\mu$m in a 16 M DRAM. Therefore, the length in the row direction occupied by the four row decoders 51c–54c is approximately 8 $\mu$m.

The increase of the layout area due to the fuse arrangement in the first embodiment of FIG. 3 and the second embodiment of FIG. 4 can be calculated as follows.

As discussed hereinbefore, the length in the row direction, occupied by the four word line driver row decoders 51a–54a is preferably approximately 12 $\mu$m in the first embodiment of FIG. 3 and the length in the row direction occupied by the four word line driver row decoders 51b–54b is preferably approximately 8 $\mu$m in the second embodiment of FIG. 4.

For example, in a 16 M memory array having 8K (1K= 1,024) storage cells in the row direction and 2K storage cells in the column direction, the number of word lines driven by a normal word line driver decoder is four.

Therefore, the row direction length of the integrated circuit memory of FIG. 5 in which the fuses are not used is 2 $\mu$m*8K/4=4,096 $\mu$m. The row direction length of the integrated circuit memory of FIG. 3 is 3 $\mu$m*8K/4=6,144 $\mu$m. Comparing the FIG. 3 embodiment to the FIG. 5 embodiment, the increase to the row direction is approximately 2,000 $\mu$m and the increase to the column direction is 5 $\mu$m.

When the second embodiment of FIG. 4 is compared with the FIG. 5 embodiment, however, the length in the row direction does not increase and the length in the column direction increases by 12 $\mu$m. Accordingly, the arrangement shown in FIG. 4 can be used to fit fuses into an existing storage cell pitch of an integrated circuit memory.

It should be appreciated that a variety of fuse types, circuit breaker devices, or even logic circuits can be used to couple the main memory decoder to the main memory array provided they can be used to sever the connection between main memory decoder and the main memory array when necessary. Nevertheless, these alternative fuse types, circuit breaker devices, or logic circuits may have certain advantages and/or disadvantages with respect to memory layout area requirements and/or memory operating speed depending on their physical geometry and operational characteristics.

The principles of the present invention have been illustrated herein as they are applied to an integrated circuit memory that includes a plurality of fuses between a main memory decoder and a main memory array. As described hereinbefore with reference to FIG. 4, when the fuses are oriented lengthwise in the row direction and are positioned such that the relative spacing between the fuses proceeds substantially along the column direction, the fuses need not use additional space in the row direction and only a minor increase in space in the column direction. Thus, fuses can be added to implement a redundancy capability without the need to significantly increase the layout area of the memory device. Due to the orientation and relative spacing of the fuses, the second embodiment of FIG. 4 needs less layout area than the first embodiment of FIG. 3. Furthermore, the use of fuses between the main memory decoder and the main memory array can allow defective storage cells to be physically segregated from the decoding circuitry. As a result, it is not necessary to introduce a delay into the decoding circuitry, which can lower the operating speed of the integrated circuit memory.

In concluding the detailed description, it should be noted that many variations and modifications can be made to the preferred embodiment without substantially departing from the principles of the present invention. All such variations and modifications are intended to be included herein within the scope of the present invention, as set forth in the following claims.

We claim:

1. An integrated circuit memory device, comprising:

a main memory array, the main memory array having first and second dimensions extending in first and second directions, respectively;

a main memory decoder for the first dimension; and a plurality of fuses between the main memory decoder and the main memory array, the plurality of fuses being arranged such that a relative spacing between the fuses proceeds substantially along the second direction.

2. A memory device as recited in claim 1, wherein the fuses are oriented such that their lengths are substantially parallel with the first direction.

3. A memory device as recited in claim 1, wherein each of the fuses has a length and a width such that the length is at least as long as the width.

4. A memory device as recited in claim 3, wherein the fuse length is approximately 5 µm and the fuse width is approximately 1 µm.

5. A memory device as recited in claim 4, wherein a pitch between a pair of adjacent fuses is at least 3 µm.

6. A memory device as recited in claim 1, wherein the main memory decoder comprises:

a normal decoder; and a driving decoder.

7. A memory device as recited in claim 6, further comprising a plurality of word line drivers that are electrically coupled to the normal decoder through the plurality of fuses, the word line drivers also being coupled to the driving decoder.

8. A memory device as recited in claim 7, further comprising:

a spare memory decoder; and a spare word line driver that is electrically coupled to a plurality of spare word lines.

9. A memory device as recited in claim 1, wherein the first dimension corresponds to rows of storage cells in the main memory array and the second dimension corresponds to columns of storage cells in the main memory array.

10. A memory device as recited in claim 1, wherein the first dimension corresponds to columns of storage cells in the main memory array and the second dimension corresponds to rows of storage cells in the main memory array.

11. An integrated circuit memory device, comprising:

a main memory array having first and second dimensions extending in first and second directions, respectively;

a main memory decoder for the first dimension; and a plurality of fuses between the main memory decoder and the main memory array that are arranged such that a relative spacing between the fuses proceeds substantially along the second direction and the fuses are oriented such that their lengths are substantially parallel with the first direction.

12. An integrated circuit memory device having first and second row decoders that generate first and second output signals respectively, and in which the wiring carrying the first and second output signals is in a column direction, comprising:

a first fuse wired in a row direction that is electrically connected to the first output signal; and a second fuse wired in a row direction that is electrically connected to the second output signal;

wherein the first and second fuses are arranged in parallel in the column direction.

13. An integrated circuit memory device having first and second column decoders that generate first and second output signals respectively, and in which the wiring carrying the first and second output signals is in a row direction, comprising:

a first fuse wired in a column direction that is electrically connected to the first output signal; and a second fuse wired in a column direction that is electrically connected to the second output signal;

wherein the first and second fuses are arranged in parallel in the row direction.

14. An integrated circuit memory device having a plurality of unit cells arranged in rows and columns, comprising:

a plurality of signal generating circuits arranged adjacent to each other that generate output signals; and a plurality of fuses wired in parallel and in a direction that crosses wiring carrying the output signals.

15. The integrated circuit memory device of claim 14, wherein the signal generating circuits are row decoders, the wiring carrying the output signals is in a column direction, and the fuses are wired in parallel in a row direction.

16. The integrated circuit memory device of claim 14, wherein the signal generating circuits are column decoders, the wiring carrying the output signals is in a row direction, and the fuses are wired in parallel in a column direction.

17. An integrated circuit memory device, comprising:

a main memory array, the main memory array having first and second dimensions extending in first and second directions, respectively;

a main memory decoder; and a plurality of fuses between the main memory decoder and the main memory array, the plurality of fuses being arranged such that a relative spacing between the fuses proceeds substantially along the second direction and being oriented such that their lengths are substantially parallel with the first direction.

18. An integrated circuit memory device as recited in claim 17, wherein the main memory decoder is for the first dimension.

19. An integrated circuit memory device as recited in claim 17, wherein at least two of the plurality of fuses are arranged in substantially the same position with respect to the first direction.

20. An integrated circuit memory device, comprising:

a main memory array, the main memory array having first and second dimensions extending in first and second directions, respectively;

a main memory decoder; and a plurality of fuses between the main memory decoder and the main memory array, the plurality of fuses being arranged such that a relative spacing between the fuses proceeds substantially along the second direction, each of the fuses having a length and a width such that the length is at least as long as the width.

21. An integrated circuit memory device as recited in claim 20, wherein the main memory decoder is for the first dimension.

22. An integrated circuit memory device as recited in claim 20, wherein the plurality of fuses are oriented such that their lengths are substantially parallel with the first direction and at least two of the plurality of fuses are arranged in substantially the same position with respect to the first direction.

23. An integrated circuit memory device, comprising:

a main memory array, the main memory array having first and second dimensions extending in first and second directions, respectively;

a main memory decoder for the first dimension, the main memory decoder comprising:

a normal decoder; and a driving decoder; and a plurality of fuses between the main memory decoder and the main memory array, the plurality of fuses being arranged such that a relative spacing between the fuses proceeds substantially along the second direction.

* * * * *